United States Patent [19]

Sato

[11] Patent Number: 5,272,799
[45] Date of Patent: Dec. 28, 1993

[54] TAPE FEEDING APPARATUS

[75] Inventor: Koji Sato, Tokyo, Japan

[73] Assignee: Kabushiki Kaisha Shinkawa, Tokyo, Japan

[21] Appl. No.: 913,865

[22] Filed: Jul. 15, 1992

[30] Foreign Application Priority Data

Jul. 15, 1991 [JP] Japan ............................. 3-198197

[51] Int. Cl.⁵ .......................................... B26D 7/01
[52] U.S. Cl. ............................... 29/281.1; 269/21
[58] Field of Search .......... 221/71; 74/128; 83/277; 269/21; 226/120, 8, 149, 150, 167, 161, 162; 156/552, 275.5, 273.9, 244.17; 29/281.1, 281.5

[56] References Cited

U.S. PATENT DOCUMENTS

| 4,396,826 | 8/1983 | Orcutt et al. | 156/273.9 |
| 4,656,906 | 4/1987 | Mozieka et al. | 269/21 |
| 5,034,083 | 7/1991 | Campanelli et al. | 156/275.5 |
| 5,052,606 | 10/1991 | Cipolla et al. | 156/552 |
| 5,089,321 | 2/1992 | Chum et al. | 156/244.17 |

FOREIGN PATENT DOCUMENTS 2-1372   1/1990  Japan .
2-273949 11/1990 Japan .

Primary Examiner—Robert C. Watson
Attorney, Agent, or Firm—Koda and Androlia

[57] ABSTRACT

A tab tape clamping mechanism including an upper clamper and a lower clamper used in bonding machines simplified in shape, easily manufactured and replaced, with almost no bending or twisting in the lower clamper is accomplished by making the lower clamper with a lower clamper plate and a lower clamper holder which holds the lower clamper plate via vacuum suction.

1 Claim, 6 Drawing Sheets

FIG. 2

TAPE FEEDING APPARATUS

BACKGROUND OF THE INVENTION

1. Field of the Invention

The present invention relates to a tape feeding apparatus equipped with a tape clamping mechanism.

2. Prior Art

A tape bonding machine which bonds a tab tape to semiconductor pellets, bumps, etc. is generally equipped with a tape clamping mechanism. The tape clamping mechanism holds the tab tape at a bonding position by its upper and lower clampers.

Prior art lower clampers are made in a single unit structure, and examples are disclosed in Japanese Patent Application Publication (Kokoku) No. 2-1372 and Japanese Patent Application Laid-Open (Kokai) No. 2-273949.

In these prior art, since the lower clamper is of a single unit structure and also has depressions for semiconductor pellets placed on a bonding platform and depressions for the bonding platform, it requires a complicated shape and a precise manufacturing plan, which results in high manufacturing cost.

In addition, due to the high temperature in the bonding tool, which would reach around 500° C., and in the bonding platform, which would be in a range from room temperature to 150° C., the lower clamper is sometimes heat-deformed during the bonding.

Furthermore, when the lower clamper needs to be replaced by another size of clamper so that the new clamper matches the type of tab tape to be used, the entire lower clamper must be replaced, which involves the loosening and tightening of clamper screws, etc. Thus, changing of the lower clamper is not an easy job.

SUMMARY OF THE INVENTION

Accordingly, the object of the present invention is to provide a tape feeding apparatus with a tape clamping mechanism that includes a lower clamper in which the lower clamper is simple in shape, manufactured easily and at low cost, replaced easily, and in which almost no bending or twisting occurs in the lower clamper.

In order to accomplish the object, the present invention is of a unique structure wherein the lower clamper is made up of a lower clamper plate and a lower clamper holder, and the lower clamper holder holds the lower clamper plate via vacuum suction.

Because the lower clamper comprises a lower clamper plate and a lower clamper holder, the lower clamper plate and the lower clamper holder can be simplified in shape, thus making the assembly easy and reducing the manufacturing costs. Also, since the lower clamper plate is held via vacuum suction, when the type of the tab tape is changed, the lower clamper plate can be replaced by another one easily and quickly. In addition, because the lower clamper plate is not fastened by screws but by vacuum suction, only very little bending or twisting, which might be caused by heat, occurs in the lower clamper plate.

BRIEF DESCRIPTION OF THE DRAWINGS

FIG. 2 is a top view thereof;

DETAILED DESCRIPTION OF THE INVENTION

One embodiment of the present invention will be described with reference to the accompanying drawings.

Figure 1:
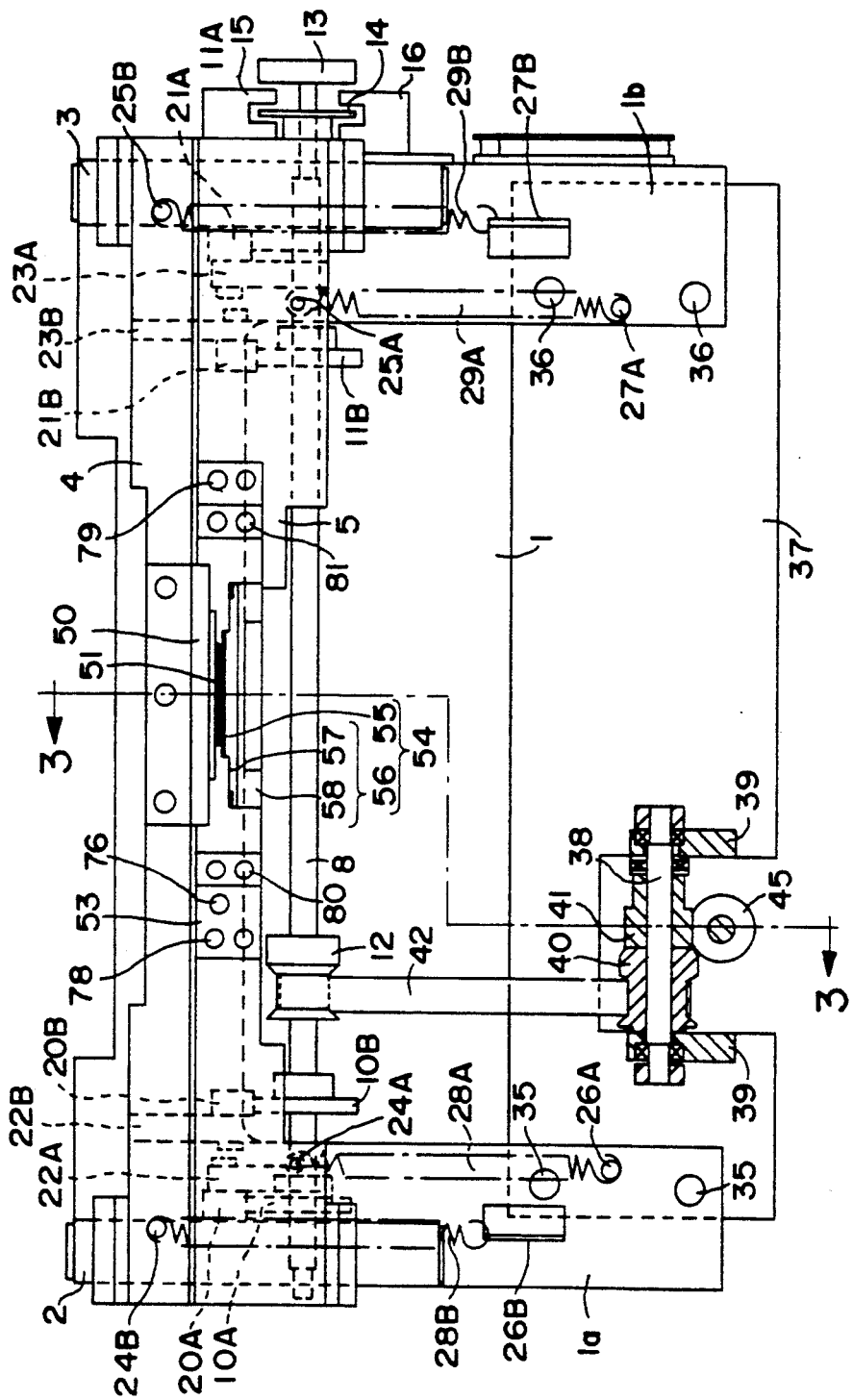
FIG. 1 is a partially cross-sectional front view of one embodiment of the present invention.
Figure 2:
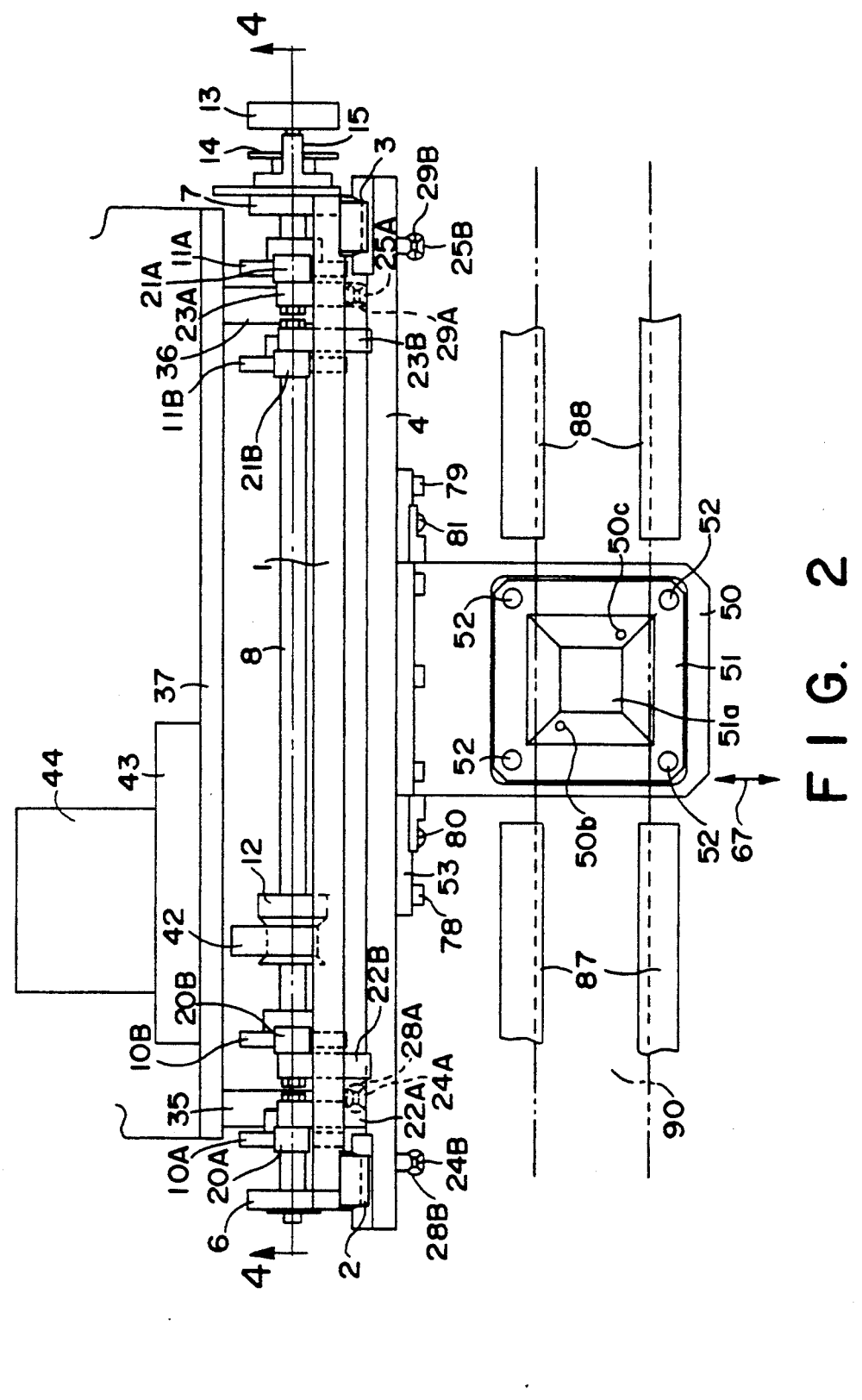

As shown in FIGS. 1 and 2, a supporting plate 1 of the tape feeding apparatus has two side plates 1a and 1b which extend downwardly, and raising-and-lowering cross roller guides 2 and 3 which are installed in an upright position are fastened to the side plates 1a and 1b, respectively.

An upper clamper supporting arm 4 and a lower clamper supporting arm 5 are respectively provided on the cross roller guides 2 and 3 so that the supporting arms 4 and 5 can move up and down along the cross roller guides 2 and 3. In addition, bearing holders 6 and 7 are fastened to the side plates 1a and 1b of the supporting plate 1, respectively, and a cam shaft 8 is supported between these bearing holders 6 and 7 in a rotatable fashion.

Figure 4:
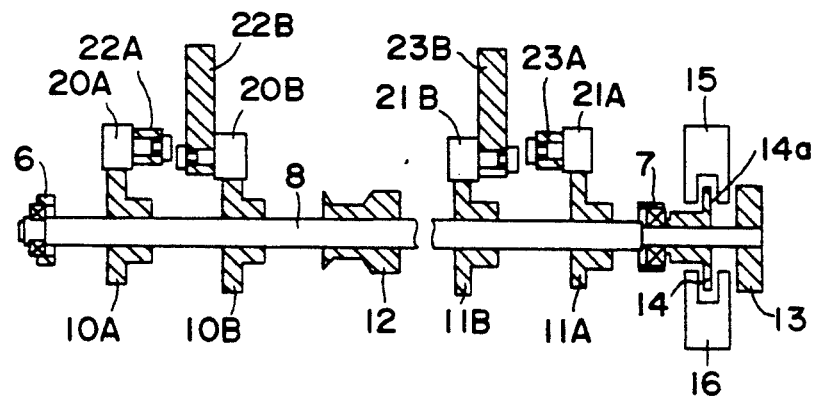
FIG. 4 is a cross section taken along the line 4—4 in FIG. 2.

As best shown in FIG. 4, lower clamper cams 10A and 11A are mounted on the cam shaft 8 at the left and right ends, respectively, and upper clamper cams 10B and 11B are also mounted on the cam shaft 8 so that they are between the lower clamper cams 10A and 11A. The cam shaft 8 is further provided with a pulley 12. The pulley 12 is between the upper clamper cams 10B and 11B. In addition, a knob 13 is attached to one end (the right end in FIG. 4) of the cam shaft 8 so that the cam shaft 8 is rotatable manually via the knob 13.

A detection cam 14 is mounted to the cam shaft 8 on the inner side of the knob 13. The detection cam 14 has a startingpoint groove 14a which is used as a mark of the start of rotation of the cam 14. Two photosensors 15 and 16 are mounted to the side plate 1b so as to face the detection cam 14 at positions 180 degrees apart.

Lower cam followers 20A and 21A are installed so as to face the upper surfaces of the lower clamper cams 10A and 11A, respectively; and upper cam followers 20B and 21B are respectively installed so as to face the upper surfaces of the upper clamper cams 10B and 11B.

Each of the cam followers 20A and 21A is rotatably supported on cam follower supporting arms 22A and 23A which are fastened to the lower clamper supporting arm 5. Also, each of the cam followers 20B and 21B is rotatably supported on cam follower supporting arms 22B and 23B which are fastened to the upper clamper supporting arm 4.

As best seen in FIG. 1, a spring 28A is mounted between an upper spring attachment pin 24A and a lower spring attachment pin 26A. Likewise, another spring 29A is mounted between an upper spring attachment pin 25A and a lower spring attachment pin 27A. The upper spring attachment pins 24A and 25A are secured to the lower clamper supporting arm 5, and the lower spring attachment pins 26A and 27A are secured to the side plates 1a and 1b. With these springs 28A and 29A, the cam followers 20A and 21A are pressed against the lower clamper cams 10A and 11A.

Similarly, a spring 28B is mounted between an upper spring attachment pin 24B and a spring attachment plate 26B. Likewise, another spring 29B is mounted between an upper spring attachment pin 25B and a spring attachment plate 27B. The upper spring attachment pins 24B and 25B are secured to the upper clamper supporting arm 4, and the spring attachment plates 26B and 27B are secured to the side plates 1a and 1b, respectively. With these springs 28B and 29B, the cam followers 20B and 21B are pressed against the upper clamper cams 10B and 11B.

Figure 3:
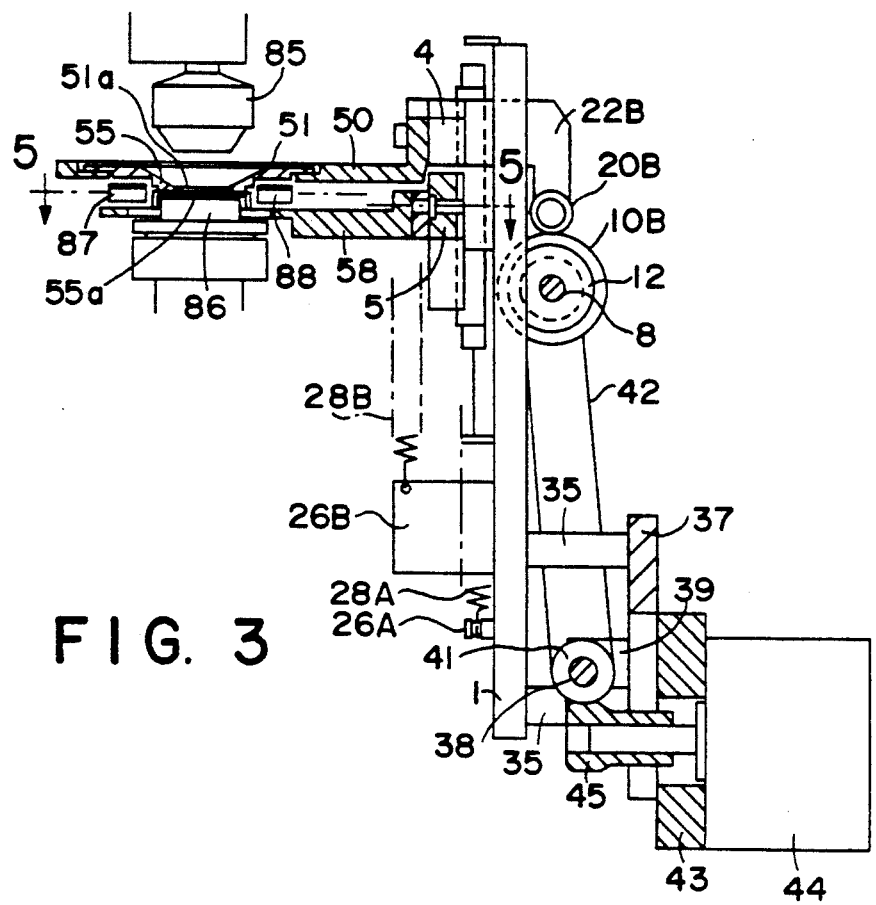
FIG. 3 is a cross section taken along the line 3—3 in FIG. 1.

The lower ends of the side plates 1a and 1b are fastened to a base plate 37 via supporting rods 35 and 36. Furthermore, a drive shaft 38 is installed parallel to the cam shaft 8 and beneath the pulley 12. This drive shaft 38 is rotatable between the two bearing holders 39 which are secured to the base plate 37. A pulley 40 and a worm wheel 41 are mounted on the drive shaft 38, and a belt 42 is mounted between the pulley 40 and the pulley 12. As seen in FIG. 3, a motor 44 is mounted to the base plate 37 via a motor support 43, and a worm gear 45 which engages with the worm wheel 41 is attached to the output shaft of the motor 44.

If the motor 44 is started, as seen from FIG. 1, the drive shaft 38 is rotated by the worm gear 45 and the worm wheel 41, and then the rotation of the drive shaft 38 is transmitted to the cam shaft 8 via the pulley 40, belt 42 and pulley 12.

When the cam shaft 8 is thus rotated, the lower cam followers 20A and 21A and the upper cam followers 20B and 21B are respectively raised and lowered according to the profiles of the lower clamper cams 10A and 11A and the upper clamper cams 10B and 11B. In other words, the lower clamper supporting arm 5 and upper clamper supporting arm 4 are raised and lowered along the cross roller guides 2 and 3.

In the present invention, the cams are formed so that when the cam shaft 8 undergoes a one half rotation, the lower clamper cams 10A and 11A use their rising profile, after which the upper clamper cams 10B and 11B use their dropping profile Also, when the cam shaft 8 undergoes the remaining half rotation, the upper clamper cams 10B and 11B use their rising profile, after which the lower clamper cams 10A and 11A use their dropping profile.

As seen in FIG. 2, an upper clamper holding plate 50 is secured to the upper clamper holding arm 4, and an upper clamper 51 is mounted to this upper clamper holding plate 50 via screws 52. The upper clamper 51 has a bonding window 51a at the center.

Figure 5:
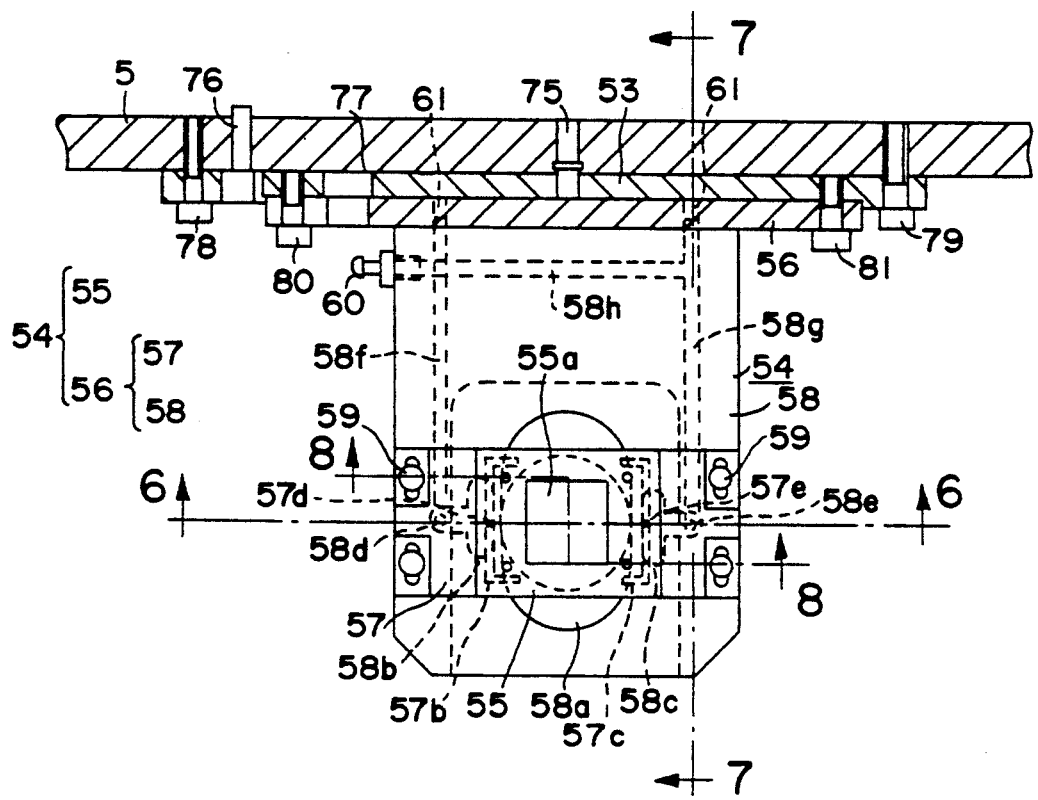
FIG. 5 is an enlarged cross section taken along the line 5—5 in FIG. 3.

Also, as seen in FIG. 5, the lower clamper supporting arm 5 is provided with a lower clamper 54 with a lower clamper adjustment plate 53 in between. As seen from FIG. 6, the lower clamper 54 consists of a lower clamper plate 55 and a lower clamper holder 56, and the lower clamper holder 56 is made up of an upper member 57 and a lower member 58 which are fastened together as a single unit by screws 59 (see FIG. 5).

The lower clamper plate 55 is approximately 0.3 to 0.5 mm in thickness and made of a metal which has minimal thermal deformation, such as an amber material, etc. The lower clamper plate 55 is provided with a bonding window 55a, which is approximately the same size as the bonding window 51a of the upper clamper 51 and at a position corresponding to the bonding window 51a.

The upper member 57 has an escape hole 57a at a position that corresponds to the bonding window 55a of the lower clamper plate 55. The lower member 58 has a central hole 58a at a position that corresponds to the escape hole 57a of the upper member 57.

Figure 11:
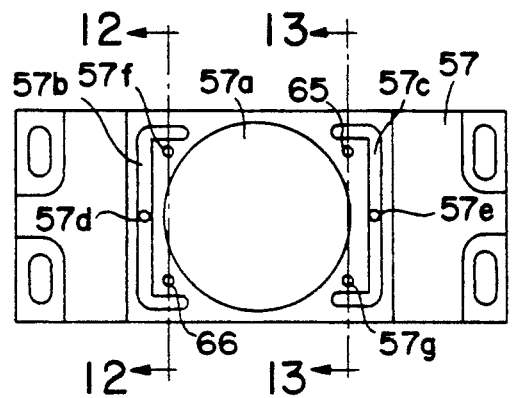
FIG. 11 is a top view of the upper member of the lower clamper holder.
Figure 12:
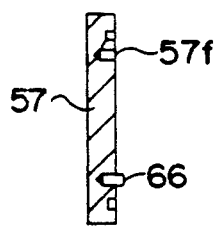
FIG. 12 is a cross section taken along the line 12—12 in FIG. 11.
Figure 13:
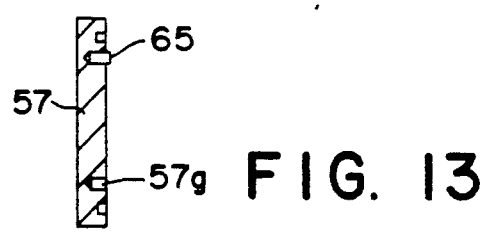
FIG. 13 is a cross section taken along the line 13—13 in FIG. 11.

As shown in FIG. 11, suction adhesion grooves 57b and 57c are formed, on the left and right, in the upper surface of the upper member 57. Suction adhesion holes 57d and 57e which pass through to the undersurface of the upper member 57 are formed in the suction adhesion grooves 57b and 57c.

Figure 9:
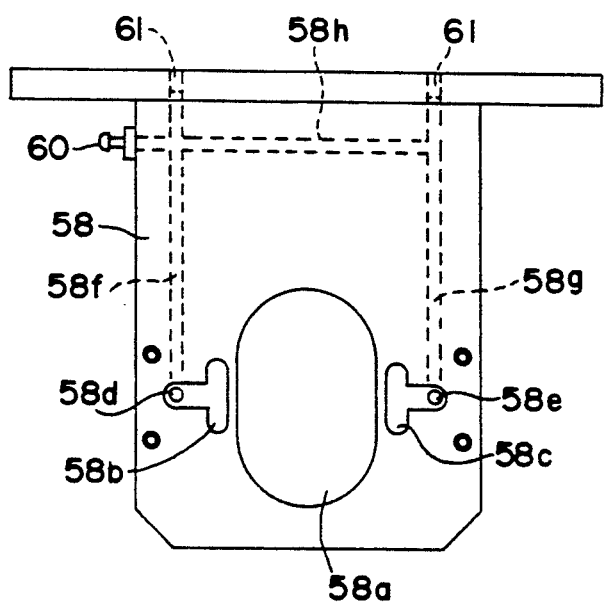
FIG. 9 is a top view of the lower member of a lower clamper holder used in the embodiment.

As shown in FIG. 9, suction ports 58b and 58c are formed in the lower member 58. These suction ports 58b and 58c positionally correspond to the suction adhesion holes 57d and 57e of the upper member, respectively, and suction adhesion holes 58d and 58e (made as blind holes) are formed in the suction ports 58b and 58c. These suction adhesion holes 58d and 58e connect, via suction adhesion paths 58f, 58g and 58h formed inside the lower member 58, with a pipe attachment fitting 60 which is installed on one side of the lower member 58. A pipe which is connected to a vacuum pump (not shown) is connected to the pipe attachment fitting 60. In FIG. 9, reference numeral 61 indicate sealing plugs.

As seen from the above, the pipe attachment fitting 60 connects with the suction adhesion holes 58d and 58e via the suction adhesion paths 58f, 58g and 58h, and the suction adhesion holes 58d and 58e connect with the suction adhesion holes 57d and 57e via the suction ports 58b and 58c, and then the suction adhesion holes 57d and 57e connect with the suction adhesion grooves 57b and 57c. Accordingly, when vacuum suction is applied to the pipe attachment fitting 60, the lower clamper plate 55 is held on the lower clamper holder 56 via the suction adhesion grooves 57b and 57c through vacuum suction adhesion supplied thereto.

Figure 10:
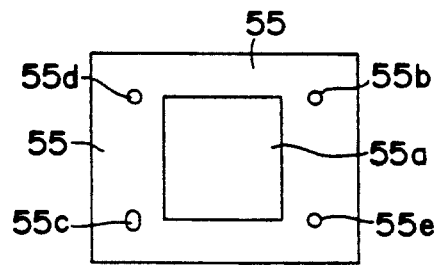
FIG. 10 is a top view of the lower clamper plate.

Furthermore, in order to position the lower clamper plate 55 on the upper member 57 of the lower clamper holder 56 (see FIG. 6), positioning pins 65 and 66 are installed vertically in the upper member 57 in two places across the escape hole 57a (see FIG. 11). As seen in FIG. 10, positioning hole 55b which fits over the positioning pin 65 and positioning slot 55c which fits over the positioning pin 66 are formed in the lower clamper plate 55. The positioning slot 55c extends in a direction in which the thermal expansion of the lower clamper holder 56 might occur. More specifically, since the lower clamper holder 56 is cantilever-fastened to the lower clamper supporting arm 5, the lower clamper holder 56 tends to expand, as seen in FIG. 2, in the direction indicated by arrow 67. Thus, the positioning slot 55c is formed long in the direction of arrow 67.

Figure 8:
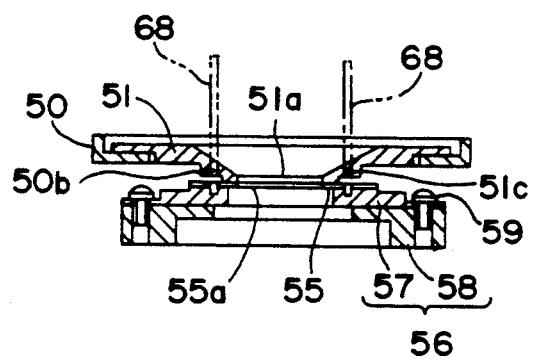
FIG. 8 is a cross section taken along the line 8—8 in FIG. 5.

Additionally, in order to position the upper clamper 51 relative to the lower clamper 54, as shown in FIGS. 10 and 11, two positioning holes 55d and 55e are formed in the lower clamper plate 55 of the lower clamper 54, and two positioning holes 57f and 57g are formed in the upper member 57. Also, two positioning holes 51b and 51c are formed (see FIG. 8) in the upper clamper 51 so that these holes 51b and 51c positionally correspond to the positioning holes 55d and 55e of the lower clamper plate 55 and the positioning holes 57f and 57g of the upper member 57. Accordingly, as shown in FIG. 8, by inserting positioning pins 68 into the positioning holes 55d and 55e of the lower clamper 54 via the positioning holes 51b and 51c of the upper clamper 51 after the screws 52 are loosened, and then by tightening back the screws 52, the upper clamper 51 is positioned relative to the lower clamper 54. This positioning adjustment of the upper clamper 51 is performed after the lower clamper 54 is positioned relative to the lower clamper supporting arm 5.

Figure 6:
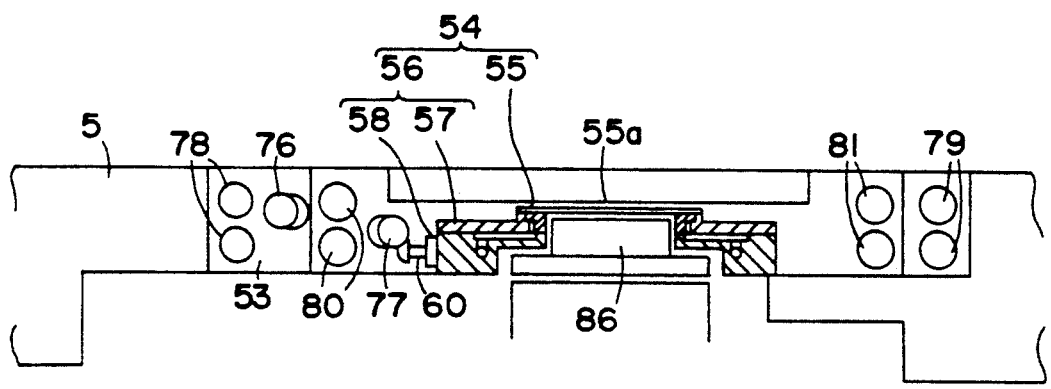
FIG. 6 is a cross section taken along the line 6—6 in FIG. 5.
Figure 7:
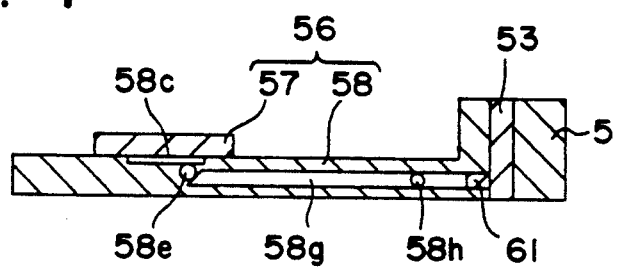
FIG. 7 is a cross section taken along the line 7—7 in FIG. 5.

As shown in FIGS. 5 and 6, a pin 75 is fastened to the lower clamper supporting arm 5, and the lower clamper adjustment plate 53 is fitted over the pin 75 in a rotatable manner. An eccentric pin 76 is rotatably fastened to the lower clamper supporting arm 5 so that the lower clamper adjustment plate 53 is fitted over the large-diameter portion of the eccentric pin 76. Moreover, the large-diameter portion of another eccentric pin 77 is inserted into the lower clamper adjustment plate 53, and the small-diameter portion of the eccentric pin 77 is inserted into the lower clamper holder 56 of the lower clamper 54. Furthermore, the lower clamper adjustment plate 53 is fastened to the lower clamper supporting arm 5 by screws 78 and 79, and the lower clamper holder 56 of the lower clamper 54 is fastened to the lower clamper adjustment plate 53 by screws 80 and 81.

Accordingly, any inclination of the lower clamper adjustment plate 53 can be adjusted by loosening the screws 78 and 79 and rotating the eccentric pin 76. Likewise, the position of the lower clamper 54 in the horizontal direction can be adjusted by loosening the screws 80 and 81 and rotating the eccentric pin 77.

As shown in FIG. 3, a bonding tool 85 which is driven in both vertical and horizontal directions by a driving means (not shown) is installed above the bonding window 51a of the upper clamper 51. A bonding stage 86 which is driven vertically and in a theta (0) direction is installed beneath the bonding window 55a of the lower clamper 54 so that a pellet (not shown) is placed on the bonding stage 86. Conveying rails 87 and 88 which guide a tab tape 90 (see FIG. 2) to the bonding windows 51a and 55a between the upper clamper 51 and the lower clamper plate 55 are installed on both sides of the upper clamper 51 and lower clamper 54.

Next, the operation will be described.

With the upper clamper 51 and lower clamper 54 separated from each other, i.e., with the upper clamper 51 in its raised position and the lower clamper 54 in its lowered position, the tab tape 90 is fed between the two clampers.

When the leadings provided on the tab tape 90 come in the area of the bonding windows 51a and 55a, and the pellet which is on the bonding stage 86 is aligned with the leads of the tab tape 90, the motor 44 is started.

When the motor is stated, the lower clamper cams 10A and 11A and the upper clamper cams 10B and 11B make a one half rotation together with the cam shaft 8. As a result, the lower clamper supporting arm 5 is first forcibly raised in accordance with the rising profile of the lower clamper cams 10A and 11a, resulting in that the lower clamper 54 is raised up to the tape feeding level of the tab tape 90. Then, the upper clamper supporting arm 4 is lowered by the force of the springs 28B and 29B in accordance with the dropping profile of the upper clamper cams 10B and 11B, so that the upper clamper 51 is lowered to the tape feeding level. The tab tape 90 is then held by the upper clamper 51 and lower clamper 54.

Next, the bonding stage 86 is raised by a driving means (not shown), so that the pellet on the bonding stage 86 approaches the tab tape 90. The bonding tool 85 is lowered to press the tab tape 90 against the pellet, and the pellet is bonded to the tab tape 90.

After the bonding is completed, the motor 44 is again rotated, which results in that the lower clamper cams 10A and 11A and the upper clamper cams 10B and 11B complete the remaining half rotation via the cam shaft 8. As a result, the upper clamper 51 is raised and thus withdrawn from the tape feeding path in accordance with the rising profile of the upper clamper cams 10B and 11B. The lower clamper 54 is then lowered and withdrawn from the tape feeding path in accordance with the dropping profile of the lower clamper cams 10A and 11A. Thus, the tab tape 90 is fed so that a next bonding portion of the tape is fed to the bonding windows 51a and 55a.

One operation is thus completed, and pellets are successively bonded to the tab tape 90 by repeating this operation.

In the above described embodiment, both the upper clamper 51 and the lower clamper 54 move in a vertical direction, but the present invention can be applied to a tape clamping mechanism in which only one of the two clampers moves vertically.

As seen from the above, since the lower clamper 54 comprises the lower clamper plate 55 and the lower clamper holder 56, the lower clamper plate 55 and the lower clamper holder 56 can be simplified in shape, reducing the manufacturing cost. In addition, because the lower clamper plate 55 is held by the lower clamper holder 56 via vacuum suction, when the type of the tape is changed, the lower clamper plate 55 is replaced quickly. Moreover, because the lower clamper plate 55 is not fastened to the lower clamper holder 56 via screws, bending and twisting in the lower clamper which could be caused by heat can be avoided.

According to the present invention, because the lower clamper is composed of a lower clamper plate and a lower clamper holder, and the clamper holder holds the clamper plate via vacuum suction, the lower clamper can be simplified in shape and manufactured easily at a reduced cost, and there is almost no bending or twisting occurring in the lower clamper.

I claim:

1. A tape clamping mechanism which clamps a tape between an upper clamper and a lower clamper, characterized in that said lower clamper comprises:

a lower clamper plate provided with a bonding window at the center and a plurality of positioning holes around said bonding window; and a lower clamper holder which is made up of an upper member and a lower member screwed together, wherein:

said upper member is provided with, at the center, an escape hole, which positionally corresponds to said bonding window, and a pair of suction adhesion grooves next to said escape hole; and said lower member is provided with a central hole which positionally corresponds to said escape hole, a pair of suction ports which are next to said central hole and positionally correspond to said suction adhesion grooves, and a suction adhesion path with one end thereof connected to a vacuum suction source and another end to said suction ports so that said lower clamper plate is held on said lower holder a via vacuum suction.

* * * * *